United States Patent [19]

Trunk et al.

[11] Patent Number: 4,945,401
[45] Date of Patent: Jul. 31, 1990

[54] HEAT DISSIPATOR FOR SEMICONDUCTOR UNIT

[75] Inventors: Edmund G. Trunk, East Meadow; Seymour Wilens, Wantagh, both of N.Y.

[73] Assignee: The Staver Company Inc., Bay Shore, N.Y.

[21] Appl. No.: 247,719

[22] Filed: Sep. 22, 1988

Related U.S. Application Data

[63] Continuation of Ser. No. 75,572, Jul. 20, 1987, abandoned.

[51] Int. Cl.$^5$ .................. H01L 23/34; H01L 23/36; H01L 23/40
[52] U.S. Cl. ........................... 357/81; 357/79; 361/386
[58] Field of Search ............... 357/74, 79, 81; 361/386; 165/80.3

[56] References Cited

U.S. PATENT DOCUMENTS

| | | | |
|---|---|---|---|
| 4,203,488 | 5/1980 | Johnson et al. | 357/81 |
| 4,408,220 | 10/1983 | Calabro | 357/81 |
| 4,471,408 | 9/1984 | Martinez | 174/52 FP |
| 4,508,163 | 4/1985 | McCarthy | 357/81 |
| 4,552,206 | 11/1985 | Johnson et al. | 357/81 |
| 4,712,159 | 12/1987 | Clemens | 357/81 |

Primary Examiner—Joseph E. Clawson, Jr.
Assistant Examiner—S. V. Clark
Attorney, Agent, or Firm—Edward H. Loveman

[57] ABSTRACT

This improved heat dissipator for mounting a semiconductor unit is made of sheet metal laminated with eutectic metal coatings. The dissipator has a planar base, narrow platelike wings, springy tabs for engaging ends of the unit, and rigid laterally angled legs. The legs bond to laterally extending metal legs of the semiconductor unit.

12 Claims, 2 Drawing Sheets

HEAT DISSIPATOR FOR SEMICONDUCTOR UNIT

This is a continuation of application Ser. No. 75,572 filed July 20, 1987, abandoned 2/13/89.

BACKGROUND OF THE INVENTION

1. Field of the Invention

This invention relates to heat dissipators for use with semiconductor units, and more particularly concerns improvements in sheet metal, winged, heat dissipators of the type in which semiconductor units are snapped into place.

2. Description of the Prior Art

U.S. Pat. No. 3,670,215 describes a type of heat dissipator which has attained wide usage. This prior heat dissipator has a stamped sheet metal body with a flat base portion, and two wing portions extending therefrom in diverging relationship. Two pairs of oppositely facing fingers were struck from the metallic sheet and bent outwardly from the base in a direction opposite to the extension of the wing portions. A semiconductor unit, having the form of a rectangular dielectric body or block containing a semiconductor element or integrated circuit, is snapped into place adjacent the base between one pair of resilient fingers which functions as springy detent or snap engagements means. The other pair of fingers follow the L-shaped contour of a pair of heat conductive metal legs or tabs which extended laterally from the body of the semiconductor unit, in surface-to-surface contact.

While this prior heat dissipator is generally satisfactory, the progress in the electronic art which have taken place since U.S. Pat. No. 3,670,215 was issued, has imposed new demands in manufacture, installation and use which the prior heat dissipators can not meet effciently. Among these new requirements are demands for reduced costs and complexity of manufacture and installation, such as greater economy in use of materials and labor for assembly, greater strength of assemblies, greater resistance to shock and vibration in use, more compact size, greater heat dissipation capability, avoidance of destruction and/or degradation of operating parameters of semiconductor units by heating methods used in soldering assemblies in place, more secure mounting of assemblies, etc.

SUMMARY OF THE INVENTION

The present invention is directed at overcoming the shortcomings listed as well as others of prior heat dissipators of the type described in the above mentioned U.S. Pat. No. 3,670,215 and in addition to providing a heat dissipator device or heat sink which is superior in many ways. The sheet metal is laminated on both sides with a thin, self-soldering, eutectic metal coating, so that the semiconductor units and the heat dissipators may be simultaneously secured in place on printed circuit boards by new, state-of-the-art, automatic, radiant wave soldering methods. The new heat dissipator has rigid, rather than flexible mounting legs which flare outwardly at angles to the base of the heat dissipator. The legs have longitudinal ridges which extend up to and into the base for greater strength, improved resistance to applied shock and vibration, and greater and faster heat dissipation. The flared, divergent, platelike wing portions of the heat dissipator are narrower than one previously used so that the overall construction is more compact. The new features and others to be described provide numerous advantages over the prior heat dissipators, such as:

1. The more compact structure, and the provision of angled, ridged mounting legs, provides increased rates of heat radiation, conduction and convection, so that semiconductor elements and integrated circuits of greater power handling capacity may be used, to operate cooler and to have a longer operating life.

2. Due to the self-soldering, laminated, eutectic coatings a more secure mounting of the semiconductor unit on the dissipator, and a more secure mounting of the heat dissipator-semiconductor unit assembly on the printed circuit board is effected.

3. Due to its rigid ridged, angled, stronger, mounting legs and more compact winged structure, the improved heat dissipator more effectively cushions the semiconductor unit against externally applied mechanical shocks and vibration, thus, prolonging the useful life of the unit.

4. The self-soldering, eutectic, laminated structure of the sheet material enables faster automatic soldering of the semiconductor unit to the heat dissipator, and of the heat dissipator to the printed circuit board, to afford large savings of time and labor in assembly.

5. The outwardly flared mounting legs reduce heat transfer back to the semiconductor unit in the heat dissipator so that the unit operates cooler and more efficiently.

6. The flaring legs of the heat dissipator enable it to receive and engage semiconductor units of a greater range of widths than has heretofore been possible.

7. Since the heat dissipator-semiconductor unit assemblies are securable together and on the printed circuit boards without hand soldering and without use of any hand tools, less skilled labor may be employed, use of solder and solder flux is eliminated, and electric energy used in fabrication is reduced, to effect large economies in manufacture.

8. Since the heat dissipator is more compact in structure than prior dissipators, savings of space installation are effected; and it becomes possible to stack more printed circuit boards in a given size assembly, which is a most important consideration in miniaturization of equipment.

9. Since hand soldering and repeated handling of dissipators and semiconductor units during assembly and installation are avoided, destruction of semiconductor units and degradation of operating parameters by excessive heating and handling heretofore experienced are prevented.

These and other objects and many of the attendant advantages of this invention will be readily appreciated as the same becomes better understood by reference to the following detailed description when considered in connection with the accompanying drawings in which:

DESCRIPTION OF THE PREFERRED EMBODIMENT

Figure 1:
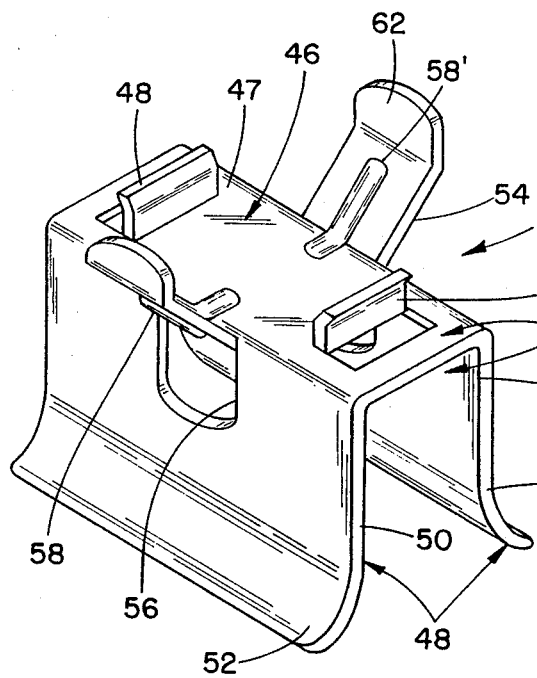
FIG. 1 is a perspective view on a large scale of a heat dissipator embodying the invention, the dissipator being shown in an inverted position.
Figure 2:
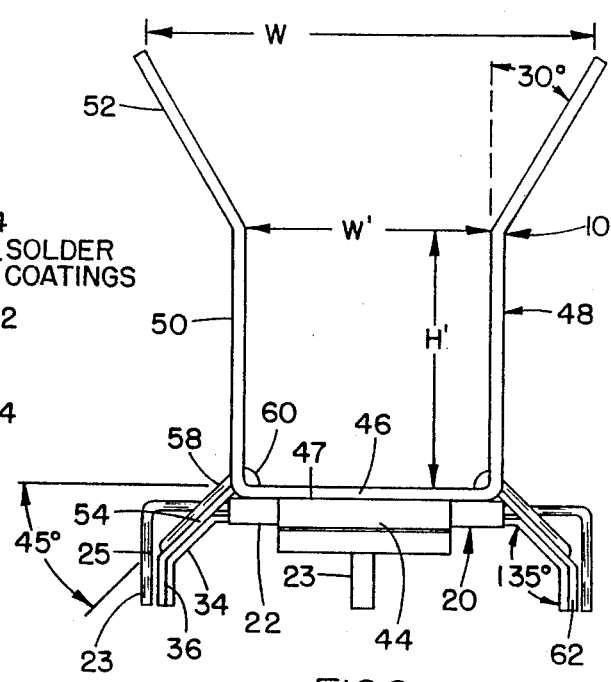
FIG. 2 is an end elevational view enlarged as compared with FIG. 1, of the heat dissipator shown in upright position, with an engaged semiconductor unit.
Figure 3:
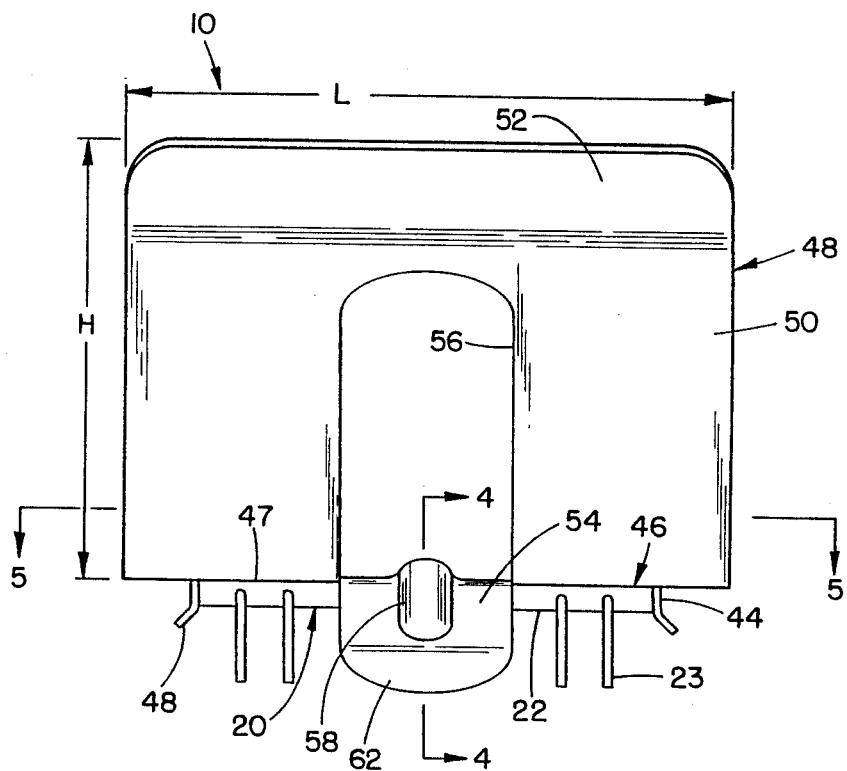
FIG. 3 is a side elevational view of the assembly of heat dissipator and semiconductor unit of FIG. 2.

Referring now to the drawings wherein like reference characters designate like or corresponding parts throughout, there is illustrated in FIGS. 1-5, a heat dissipator device, generally designated as reference numeral 10 embodying the invention. The device 10 is fabricated from a flat blank of laminated sheet material by die-cutting and stamping the sheet material to the form shown in FIGS. 1-5. The fabricated device 10 is adapted to receive a semiconductor unit generally designated as reference numeral 20 shown in FIGS. 2-6. The unit 20 has a plastic or ceramic body in the form of an elongated rectangular block 22. Four wire leads 23 extend from each narrow side 24 of the block 22. The wire leads 23 have bent ends 24 for engaging in holes in a printed circuit board to make contact there with terminals of an external circuit. A miniature semiconductor element 28 such as an integrated circuit is embedded in the block 22 and connected to the leads 23. The element 28 is mounted in a thin metal strip 30 which extends through the block 22 transversely thereof. End portions 32 of the strip 30 extend laterally of the sides 24 and then are bent to define a pair of legs 34 disposed at 45 degree angles to the strip ends 32. At each end of each leg 34 is a flat tab bent at 45 degree angles to the leg 34. The tabs 36 are parallel to the narrow flat sides 24 of the block 22 which has a flat rectangular top 38 and a pair of flat opposed rectangular ends 42.

The block 22 is snapped into place between a pair of tabs 44 struck outwardly from a rectangular panel which forms a base 46 of the heat dissipator 10. The flat top 38 abuts an adjacent side 47 of the base 46. The tabs 44 engage the ends 42 of the block 22. The tabs 44 have outwardly bent ends 48 which facilitate insertion of the block 22 therebetween. There is springy engagement between the block 22 and the tabs 44 to hold the block 22 in place with the top 38 of the block 22 in abutment with the outer side 47 of the base 46.

The heat dissipator 10 has a pair of platelike wings 48 bent upwardly from the base 46. Each of the wings 48 have flat panels 50 which extend parallel to each other or slightly divergent for a distance H' which is about one half or slightly more than the entire height H of each of the wings 48 taken in a plane direction perpendicular to the base 46. Flat or curved ends 52 of each of the wings flare 48 outwardly at approximately 30 degree angles. The width W of the device 10 at its widest is about twice the width W' of the base 46. The longer length L of the device 10 in a plane parallel to the base 46 is about twice the height H of the device 10.

A leg 54 is struck outwardly from each of the panels 50 leaving an opening 56. A leg 54 is bent away from the panel 50 at an angle of approximately 45 degrees from the horizontal. Ridges 58 are formed in the legs 54 and extend longitudinally upward to terminate in bulges 60 formed on the base 46 just inwardly of 15 the panels 50. Grooves 58' are defined at inner or under sides of the legs 54. The ridges 58 serve to strengthen the legs, absorb mechanical shocks and vibration, and increase the rates of heat conduction and radiation from the semiconductor unit 20. Free ends of the legs 54 each define a flat tab 62 bent at 135 20 degree angles to the outwardly flaring portions of the respective leg 54 so that the tabs 62 are substantially parallel to each other and to the panels 50, and perpendicular to the base 46. By this arrangement the legs 34 and tabs 36 of the unit 20 nest inside the legs 54 and the tabs 62 in surface-to-25 surface contact for direct heat conduction from the block 22 to the legs 54.

Figure 4:
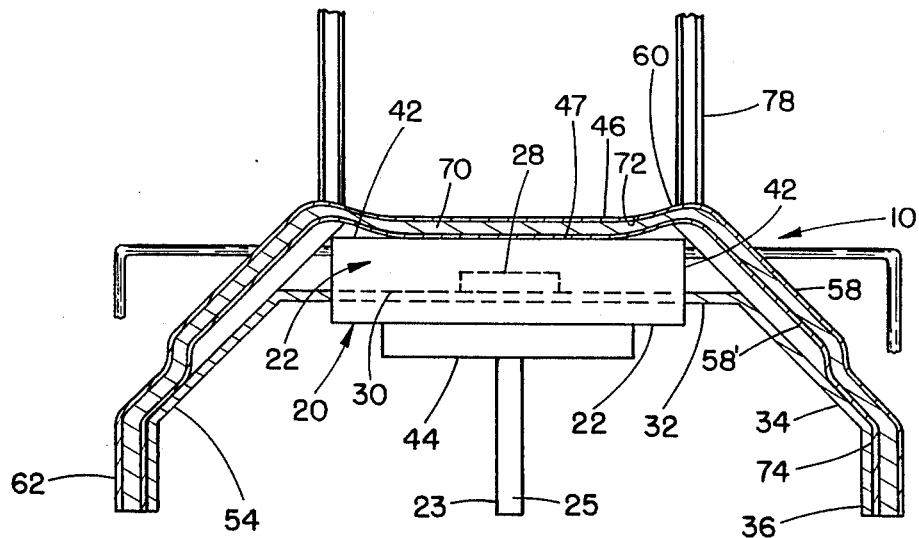
FIG. 4 is a further enlarged fragmentary crosssectional view taken along line 4—4 of FIG. 3.
Figure 5:
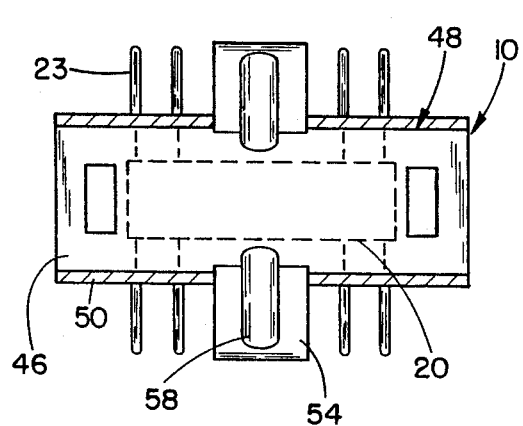
FIG. 5 is a reduced longitudinal sectional view taken along line 5—5 of FIG. 3.
Figure 6:
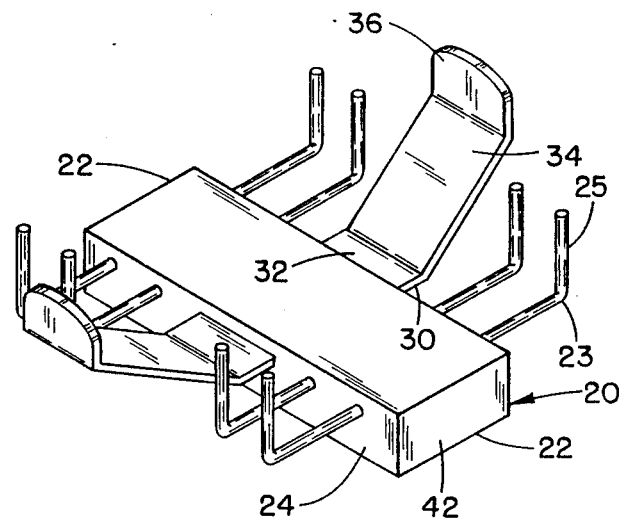
FIG. 6 is a perspective view on an enlarged scale of a semiconductor unit such as the one installed in the heat dissipator of FIGS. 2-5.

The sheet metal body of the heat dissipator 10 is formed of a thin cooper core 70 about 0.015 inches thick; see FIG. 4. Two thin coats 72 and 74 of eutectic tin alloy solder respectively applied to opposite sides of the core 70. The coats are each about 0.001 inches in thickness. The overall thickness of the laminated structure is about 0.017 inches which is about one half the thickness of sheet metal heretofore used in prior heat dissipators of the present type, as described in the above mentioned U.S. Pat. No. 3,670,215. It will be noted that the inner facing sides of the legs 54 and the tabs 62 covered with the solder layer 74 and are in abutment with the facing outer sides of the legs 34 and the tabs 36 of the semiconductor unit. The juxtaposed tabs 36, 62 will fit into slots in a printed 10 circuit board in contact with metal retainer members. When radiant heating is applied to the assembly of heat dissipator 10 and semiconductor unit 20 on the printed circuit board, tabs 36, 62 fuse together with the metal retainer members at the same time as the ends 25 of wire leads 23 bond to the circuit terminals in the printed circuit board. The heating is quickly applied so that the assembly does not heat up excessively. This avoids the possibility of overheating the unit 20 during the soldering process, and prevents destruction or deterioration of the unit which occurs only too often with prior heat dissipator 20 units installed by hand soldering methods. By the present arrangement the device 10 and unit 20 are locked together with the circuit board in a vibration and shock resistant assembly.

In a preferred size of heat dissipator 10, the height H is about three quarters of an inch which is about one half of the height of the prior heat dissipator described in above mentioned U.S. Pat. No. 3,670,215. This narrower structure provides several advantages over the prior structure which has wider sides formed with slits defining louvers. The narrower structure of the wings 48 renders them more rigid and thus, more resistance to vibration. Even though the metal structure of the wings 48 is thinner than that used in the prior heat dissipator, the imperforate wing panels 52 are stronger because they avoid the slits and louvers used in the prior heat dissipator of the above mentioned patent. The shorter height H of the device 10 makes it possible to stack printed circuit boards closer to each other to increase the amount of circuitry in equipment where the boards are installed.

Since the legs 54 flare outwardly, units 20 of different widths may be installed in devices 10 by adjusting the flare of the legs 34 of the units 20 so that they make face-to-face contact with the insides of the legs 54, and the tabs 36 register and contact with the tabs 62.

It will be apparent from the foregoing detailed description of the heat dissipator device, that its structure adapts it to provide increased rates of heat radiation, conduction and convection, so that the semiconductor unit 10 operates cooler and thus, has a more extended operating life. The self-soldering, laminated, eutectic structure enables more secure mounting of unit 10 and more secure mounting of the assembly of the heat dissipator and semiconductor unit on the printed circuit board. The rigid, angled, ridged legs of the heat dissipator 10 improves heat conduction therefrom and increases heat radiation and convection therefrom. They also provide more effective cushioning against mechanical shocks and vibration. The laminated, eutectic solder layers make possible automatic soldering of the assembly to reduce labor cost of manufacture, and to reduce handling. Overheating of the units 10 during installation is avoided. The more compact structure reduces the space required for installation.

It must be emphasized at this point that the platelike wings 48 of the heat dissipator 10 are about one half as wide as those specified for the heat dissipator described in the above mentioned U.S. Pat. No. 3,670,215. Furthermore, the laminated sheet material of heat dissipator 10 is about one half the thickness of the sheet metal specified for the heat dissipator described in the patent. Thus, the present invention effects a saving ranging from 50% to 75% in the amount and cost of sheet material used in making the heat dissipator. At the same time, the present heat dissipator 10 provides improved performance as a heat sink as well as affording all the many advantages in fabrication, installation and operation described above.

It should be understood that the foregoing relates to only a preferred embodiment of the invention which has been by way of example only and that it is intended to cover all changes and modifications of the example of the invention herein chosen for the purpose of the disclosure, which do not constitute departures from the spirit and scope of the invention.

What is claimed is:

1. A heat dissipator for retaining and supporting a generally rectangular semiconductor unit on a circuit board, said semiconductor unit having flat opposite ends, flat top, flat opposite sides, and a pair of laterally extending metal legs, said heat dissipator comprising:
   a highly heat conductive stamped sheet metal member, said member having:
   a planar base;
   a pair of spaced springy tabs struck out from and extending away from one side of said base, each of said tabs engaging respectively one of said opposite ends of said semiconductor unit, with only said top of said semiconductor unit abutting said base for conduction of heat from said semiconductor unit;
   a pair of rigid, platelike wings diverging at least in part from each other and bent away from the other side of said base to conduct and to radiate heat away from said semiconductor unit; and
   a pair of spaced base legs stuck out from said wings, and disposed laterally of said base at obtuse angles to said wings, to engage said legs of said semiconductor unit, to conduct and radiate heat therefrom, and to cooperate with said tabs in retaining said semiconductor unit on said base and on said circuit board, said base legs being formed with longitudinal ridges terminating at said base for strengthening and maintaining rigidity of said base legs, and for maximizing conduction and radiation of heat from said semiconductor unit via said legs of said semiconductor unit.

2. A heat dissipator as defined in claim 1, wherein said sheet metal member has a eutectic metal coating on at least one side thereof for bonding by fusion to said legs of said unit and to metal retainer means in said circuit board.

3. A heat dissipator as defined in claim 2, wherein said other legs of said body are disposable in surface-to-surface contact with said legs of said unit for bonding by fusion thereto.

4. A heat dissipator as defined in claim 3, wherein said other legs of said body terminate in flat other tabs engageable in slots in said circuit board for fusion to said retainer means in said circuit board.

5. A heat dissipator as defined in claim 4, wherein said wings are substantially of equal width in planes perpendicular to said base, said width being approximately one half the length of said body taken in a plane parallel to said base, to minimize the space occupied by said body when mounted on said circuit board.

6. A heat dissipator as defined in claim 5, wherein the overall thickness of said sheet metal is not more than 0.020 inches to conserve maximum material in fabrication of said body.

7. An assembly as defined in claim 6, wherein said sheet metal member has eutectic metal coatings on opposite sides thereof for bonding by fusion to said first legs of said body and to metal retainer means in said circuit board.

8. An assembly as defined in claim 7, wherein said other legs of said member are disposable in surface-to-surface contact with said first legs of said body for bonding by fusion thereto.

9. An assembly as defined in claim 8, wherein said first legs of said body and said other legs of said member terminate in flat other tabs abutted to each other and engeable in slots in said circuit board for fusion to said retainer means in said circuit board.

10. An assembly as defined in claim 9, wherein said wings are substantially of equal width in planes perpendicular to said base, said width being approximately one have the length of said body taken on a plane parallel to said base, to minimize space occupied by said heat dissipator when mounted with said unit on said circuit board.

11. An assembly as defined in claim 10, wherein the overall thickness of said sheet metal is not more than 0.020 inches to conserve maximum material in fabrication of said heat dissipator.

12. An assembly comprising:
   a semiconductor unit having a rectangular body with flat opposite ends flat top and flat sides with first metal legs extending laterally from said sides; and
   a heat dissipator supporting said semiconductor unit for mounting the same on a slotted circuit board, said heat dissipator comprising:
   a highly heat conductive stamped sheet metal member, said member having:
   a planar base;
   a pair of spaced springy tabs struck out from said member and extending away from one side of said base to engage said opposite ends of said body, with said top of said body abutting said base for conduction of heat from said semiconductor unit;
   a pair of rigid, platelike wings diverging at least in part from each other and bent away from the other side of said base to conduct and to radiate heat away from said semiconductor unit; and
   a pair of spaced rigid other legs struck out from said wings, and disposed laterally of said base at obtuse angles to said wings, to engage said first legs of said body, to conduct and radiate heat therefrom, and to cooperate with said tabs in retaining said semiconductor unit on said heat dissipator and on said circuit board, said other legs being formed with longitudinal ridges terminating at said base for strengthening and maintaining rigidity of said other legs, and for maximizing conduction and radiation of heat from said semiconductor unit via said first legs thereof.

* * * * *